(12) United States Patent
Koizumi et al.

(10) Patent No.: US 8,631,548 B2
(45) Date of Patent: Jan. 21, 2014

(54) METHOD FOR PRODUCING CRYSTALLOGRAPHICALLY ORIENTED CERAMIC

(75) Inventors: Takaaki Koizumi, Tajimi (JP); Hideki Shimizu, Ohbu (JP)

(73) Assignee: NGK Insulators, Ltd., Nagoya (JP)

( * ) Notice: Subject to any disclaimer, the term of this patent is extended or adjusted under 35 U.S.C. 154(b) by 793 days.

(21) Appl. No.: 12/559,583

(22) Filed: Sep. 15, 2009

(65) Prior Publication Data

US 2010/0071179 A1 Mar. 25, 2010

(30) Foreign Application Priority Data

Sep. 24, 2008 (JP) ................................. 2008-243992
Jul. 24, 2009 (JP) ................................. 2009-172758

(51) Int. Cl.
*H01L 41/187* (2006.01)
*H04R 17/10* (2006.01)

(52) U.S. Cl.
USPC . 29/25.35; 29/846; 252/62.9 R; 252/62.9 PZ; 427/100; 310/358

(58) Field of Classification Search
USPC ..... 29/25.35, 846, 851; 252/62.9 R, 62.9 PZ; 427/100; 310/357, 358
See application file for complete search history.

(56) References Cited

U.S. PATENT DOCUMENTS

| 6,013,311 | A  | * | 1/2000  | Chatterjee et al. ............ 427/100 |
| 6,093,338 | A  |   | 7/2000  | Tani et al. |
| 6,979,938 | B2 | * | 12/2005 | Solberg ........................ 310/358 |
| 7,065,846 | B2 | * | 6/2006  | Schreiner et al. ............ 29/25.35 |
| 2004/0214723 | A1 |   | 10/2004 | Nonoyama et al. |
| 2005/0255239 | A1 | * | 11/2005 | Zhu et al. .................. 427/100 X |
| 2007/0228318 | A1 |   | 10/2007 | Yuuya |

FOREIGN PATENT DOCUMENTS

| EP | 1 457 471 | A2 |   | 9/2004  |                |
| JP | 02125677  | A  | * | 5/1990  | ............... 29/25.35 X |
| JP | 11-060333 | A1 |   | 3/1999  |                |
| JP | 2000208828| A  | * | 7/2000  |                |
| JP | 2004-300019| A1|   | 10/2004 |                |

* cited by examiner

*Primary Examiner* — A. Dexter Tugbang
(74) *Attorney, Agent, or Firm* — Burr & Brown, PLLC

(57) ABSTRACT

A method for producing a piezoelectric/electrostrictive body containing a crystallographically oriented ceramic including a particle-preparing step of preparing pseudocubic particles having substantially a cubic shape; a dispersing step of dispersing the pseudocubic particles in a solvent; a particle section-forming step of forming a seed section and a matrix section directly or indirectly on a base, the seed section being formed by arranging the dispersed pseudocubic particles in a predetermined plane direction, the matrix section being formed from matrix particles having a desired composition; and a firing step of firing the seed section and matrix section formed on the base.

18 Claims, 7 Drawing Sheets

METHOD FOR PRODUCING CRYSTALLOGRAPHICALLY ORIENTED CERAMIC

BACKGROUND OF THE INVENTION

1. Field of the Invention

The present invention relates to a method for producing crystallographically oriented ceramic.

2. Description of the Related Art

Conventionally proposed methods for producing crystallographically oriented ceramics are as follows: for example, a guest material and an additive are added to a host material which is tabular and which has a grown specific crystal plane and the host material is shaped so as to be oriented and is sintered by heating (Patent Documents 1 and 2).

PRIOR ART DOCUMENTS

Patent Document 1: Japanese Unexamined Patent Application Publication No. 11-60333

Patent Document 2: Japanese Unexamined Patent Application Publication No. 2004-300019

SUMMARY OF THE INVENTION

However, in a method for producing a crystallographically oriented ceramic disclosed in Patent Document 1 or 2, a material which is tabular and which has a grown specific crystal plane has a layered perovskite structure and a specific composition and other components are left out of consideration; hence, piezoelectric/electrostrictive properties cannot be enhanced in some cases. An additive needs to be used to prepare tabular particles and therefore a desired composition cannot be sometimes achieved.

The present invention has been made to solve such problems and has a main object to provide a method for producing a crystallographically oriented ceramic having properties that can be enhanced.

The inventors have intensively studied to achieve the above object and have found that the degree of orientation of crystals is improved and therefore properties (piezoelectric/electrostrictive properties and the like) of ceramics are enhanced in such a manner that substantially cubic particles, that is, pseudocubic particles are dispersed in a solvent and the dispersed pseudocubic particles are arranged on a base in a predetermined plane direction and then co-fired with matrix particles. This has led to the completion of the present invention.

That is, a method for producing a crystallographically oriented ceramic according to the present invention includes:

a particle-preparing step of preparing pseudocubic particles having substantially a cubic shape;

a dispersing step of dispersing the pseudocubic particles in a solvent;

a particle section-forming step of forming a seed section and a matrix section directly or indirectly on a predetermined base, the seed section being formed by arranging the dispersed pseudocubic particles in a predetermined plane direction, the matrix section being formed from matrix particles having a desired composition; and a firing step of firing the seed section and matrix section formed on the base such that the crystallographic orientation of the matrix particles contained in the matrix section is adjusted to the crystallographic orientation of the pseudocubic particles which are contained in the seed section and which are arranged in the predetermined plane direction.

In the crystallographically oriented ceramic, properties can be further enhanced. In order to improve the orientation of crystals, for example, tabular particles with high shape anisotropy (aspect ratio) is sometimes used such that the crystallographic orientation of the matrix particles is adjusted to the crystallographic orientation of the tabular particles. However, in this method, the preparation of tabular particles having a larger aspect ratio leads to an increase in crystal orientation and therefore complicated operations are required for an increase in crystal orientation. Since the pseudocubic particles are arranged in the plane direction, the crystallographic orientation of the matrix particles can be adjusted without using any tabular particles and the crystal orientation can be readily enhanced. Therefore, for example, piezoelectric/electrostrictive properties can be probably enhanced. The expression "something is formed indirectly on a base" as used herein means that something is formed above a base with another member (for example, an electrode or the like) placed therebetween.

BRIEF DESCRIPTION OF THE DRAWINGS

FIG. 2A is an illustration after a first electrode-forming step, FIG. 2B is an illustration of a first particle section-forming step, FIG. 2C is an illustration of a second particle section-forming step, FIG. 2D is an illustration of a base taken out of slurry, FIG. 2E is an illustration after a firing step, and FIG. 2F is an illustration after a second electrode-forming step.

FIG. 4A is an illustration after a first electrode-forming step, FIG. 4B is an illustration of a second particle section-forming step, FIG. 4C is an illustration of a first particle section-forming step, FIG. 4D is an illustration of a base taken out of slurry, FIG. 4E is an illustration after a firing step, and FIG. 4F is an illustration after a second electrode-forming step.

FIG. 5A is an illustration of a step of forming a resist layer 38, FIG. 5B is an illustration of a step of forming a seed section 32, FIG. 5C is an illustration of a step of forming a matrix section 34.

DETAILED DESCRIPTION OF THE PREFERRED EMBODIMENTS

Figure 1A:
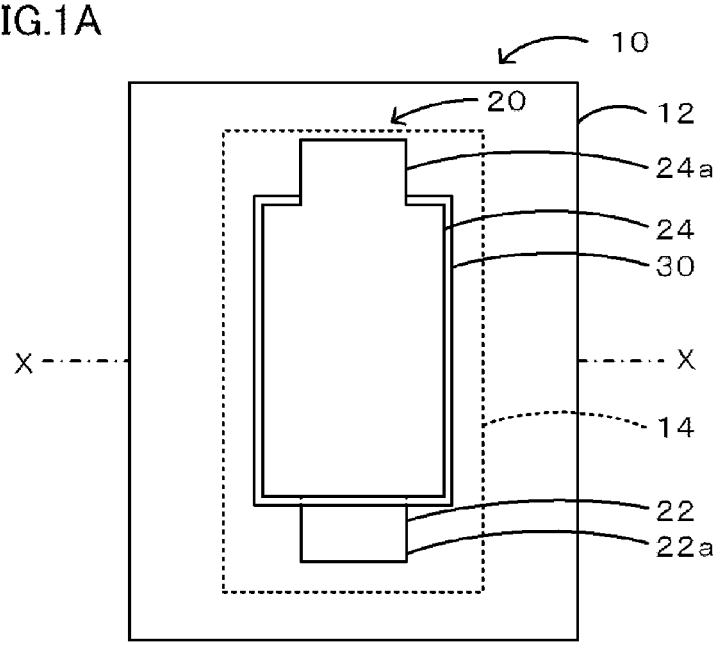
FIGS. 1A and 1B are illustrations of an example of an actuator 10 including a piezoelectric/electrostrictive device 20 according to an embodiment of the present invention.
Figure 1B:
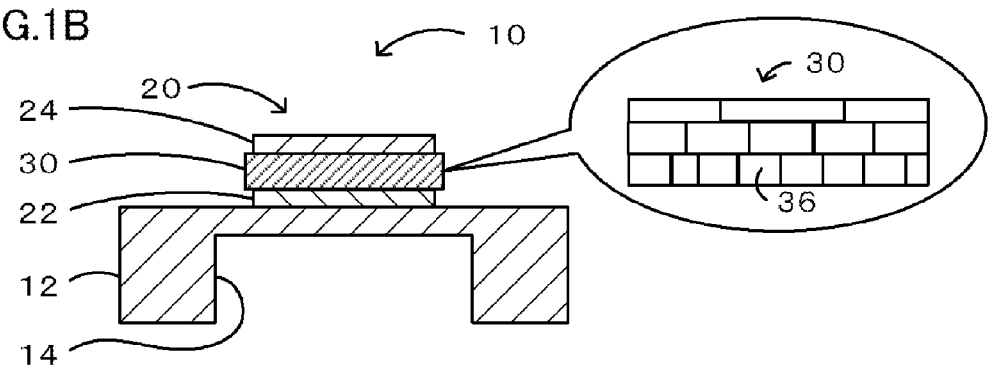

A piezoelectric/electrostrictive device containing a crystallographically oriented ceramic according to the present invention will now be described with reference to the attached drawings. FIGS. 1A and 1B are illustrations of an example of an actuator 10 including a piezoelectric/electrostrictive device 20 according to an embodiment of the present invention. FIG. 1A is a plan view of the actuator 10 and FIG. 1B is a sectional view taken along the line X-X of FIG. 1A. The actuator 10 of this embodiment includes a base 12 having a space section 14 open downwardly, a first electrode 22 that is disposed on the upper surface of the base 12 so as to be located above the space section 14, a piezoelectric/electrostrictive body 30 which is disposed on the first electrode 22 and which contains a crystallographically oriented ceramic changing its volume in response to the input or output of electricity, and a second electrode 24 disposed on the piezoelectric/electrostrictive body 30. The actuator 10 drives the piezoelectric/electrostrictive body 30 by applying a voltage thereto to apply pressure to a fluid (such as a liquid) contained in the space section 14 of the base 12.

The base 12 is preferably made of a ceramic containing at least one selected from the group consisting of stabilized zirconium oxide, aluminum oxide, magnesium oxide, mullite, aluminum nitride, and silicon nitride and more preferably stabilized zirconium oxide because of the high mechanical strength and toughness thereof. The term "stabilized zirconium oxide" as used herein refers to zirconium oxide of which the phase transition is suppressed by the addition of a stabilizer and covers partially stabilized zirconium oxide in addition to stabilized zirconium oxide. The stabilized zirconium oxide used may contain one to 30 mole percent of a stabilizer such as calcium oxide, magnesium oxide, yttrium oxide, scandium oxide, ytterbium oxide, cerium oxide, or an oxide of a rare-earth metal. In particular, the stabilized zirconium oxide used preferably contains yttrium oxide, which serves as a stabilizer, because the mechanical strength of a vibrating section is particularly increased. The content of yttrium oxide therein is preferably 1.5 to six mole percent and more preferably two to four mole percent. The stabilized zirconium oxide used preferably further contains 0.1 to five mole percent of aluminum oxide. The crystalline phase of the stabilized zirconium oxide used may be a mixture of cubic and monoclinic phases; a mixture of tetragonal and monoclinic phases; or a mixture of cubic, tetragonal, and monoclinic phases and the major crystalline phase thereof is a tetragonal phase or a mixture of tetragonal and cubic phases in view of strength, toughness, and durability.

The first electrode 22 is a rectangular member and includes a rectangular tab 22a connected externally. The first electrode 22 may be made of a material that is at least one selected from the group consisting of platinum, palladium, ruthenium, gold, silver, and an alloy containing one or more of these metals. In particular, platinum or an alloy principally containing platinum is preferably used because of the high heat resistance thereof in consideration of firing. The second electrode 24 has substantially the same configuration as that of the first electrode 22 except that the second electrode 24 includes a tab 24a located on the opposed side of the tab 22a.

The first electrode 22 may have a sandwich structure, a comb structure, a tiger skin (tigroid) structure, or the like. When the piezoelectric/electrostrictive body 30 is oriented so as to have a polarization axis in a plane parallel to the base 12, the first electrode 22 preferably has such a sandwich or tiger skin structure because the direction of an electric field is parallel to the base 12. This is effective in achieving higher piezoelectric/electrostrictive properties as compared to non-oriented piezoelectric/electrostrictive bodies. When the piezoelectric/electrostrictive body 30 is oriented so as to have a polarization axis perpendicular to the base 12, the first electrode 22 preferably has a sandwiched device structure shown in FIG. 1 because the direction of an electric field coincides with the direction of the polarization axis. The term "polarization axis" as used herein refers to the direction in which ions are displaced to produce spontaneous polarization and in which high piezoelectric properties are obtained. For example, perovskite compound has a polarization axis parallel to the c-axis thereof and a layered compound such as $Bi_4Ti_3O_{12}$ has a polarization axis in the in-plane direction thereof. The second electrode 24 is as well as the first electrode 22.

The piezoelectric/electrostrictive body 30 has a rectangular outer shape and is disposed indirectly on the base 12 in such a state that the piezoelectric/electrostrictive body 30 is sandwiched between the first and second electrodes 22 and 24. The piezoelectric/electrostrictive body 30 is a ceramic film with a thickness of 0.5 to 20 μm (2 μm herein) and contains a plurality of oriented crystals 36 that each have a specific crystal plane oriented in a specific direction. The term "ceramic film" as used herein does not refer to a film crystallized by heat treatment but refers to a film formed by growing crystal grains crystallized by heat treatment. The piezoelectric/electrostrictive body 30 may include a single layer or a plurality of layers. Whether the piezoelectric/electrostrictive body 30 has a layered structure can be determined by observing the cross section of the piezoelectric/electrostrictive device 20. The piezoelectric/electrostrictive body 30 preferably has a crystal plane oriented in the direction of an electric field, that is, oriented perpendicularly to surfaces of the first and second electrodes 22 and 24, the electric field direction being a specific direction. The piezoelectric/electrostrictive body 30 has a crystal orientation and composition gradient perpendicular to the surfaces of the first and second electrodes 22 and 24. In the piezoelectric/electrostrictive body 30, the degree of orientation of the specific crystal plane is preferably 25% or more, more preferably 306 or more, further more preferably 50% or more, and most preferably 80% or more as determined by the Lotgering method. When the degree of orientation of the specific crystal plane is or more, higher piezoelectric/electrostrictive properties can be obtained. The specific crystal plane may be a pseudocubic (100) plane in the plane of the piezoelectric/electrostrictive body 30. The term "pseudocubic (100)" as used herein means that although an isotropic perovskite-type oxide has a structure, such as a tetragonal, rhombic, or trigonal structure, which is slightly distorted from the cubic structure, the structure of the oxide is considered to be a cubic structure because of the slight distortion thereof and is designated by the Miller indices. The degree of orientation determined by the Lotgering method is calculated from Equation (1) below after XRD patterns of oriented planes of the crystallographically oriented ceramic are measured. In Equation (1), ΣI(hkl) is the sum of the X-ray diffraction intensities of all crystal planes (hkl) measured in the piezoelectric/electrostrictive body 30, $ΣI_0$(hkl) is the sum of the X-ray diffraction intensities of all crystal planes (hkl) measured in a non-oriented body having the same composition as that of the piezoelectric/electrostrictive body 30, Σ'I (HKL) is the sum of the X-ray diffraction intensities of crystallographically equivalent specific crystal planes (for example, (100) planes) measured in the piezoelectric/electrostrictive body 30, and $Σ'I_0$(HKL) is the sum of the X-ray diffraction intensities of specific crystal planes measured in the non-oriented body having the same composition as that of the piezoelectric/electrostrictive body 30.

$$\text{Degree of orientation} = \frac{\frac{\Sigma' I(HKL)}{\Sigma I(hkl)} - \frac{\Sigma' I_0(HKL)}{\Sigma I_0(hkl)}}{1 - \frac{\Sigma' I_0(HKL)}{\Sigma I_0(hkl)}} \times 100\% \qquad \text{Equation (1)}$$

In the piezoelectric/electrostrictive body 30, the oriented crystals 36 may be made from inorganic particles growing into crystal grains with an isotropic, polyhedral shape or inorganic particles, such as particles of $Bi_4Ti_3O_{12}$ or $SrBi_2Ta_2O_9$, which is a layered compound, growing into crystal grains with an anisotropic shape and are preferably made of such inorganic particles (pseudocubic particles) growing into crystal grains with an isotropic, polyhedral shape. The expression "growing into crystal grains with an isotropic, polyhedral shape" as used herein is described below in detail and means that a specific crystal plane can be grown depending on circumstances. The term "isotropic, polyhedral shape" as used herein refers to, for example, a cubic shape. The term "isotropic shape" as used herein refers to a shape, such as a tabular shape, a strip shape, a pillar shape, a needle shape, or a scale shape, having a large longitudinal-to-transverse axis ratio (aspect ratio) (for example, an aspect ratio of two or more). The piezoelectric/electrostrictive body 30 is preferably made of an oxide, represented by the formula $ABO_3$, having a perovskite structure. An example of the oxide is Lead zirconate titanate, which is represented by the formula $ABO_3$ and in which the A-sites are occupied by Pb atoms and the B-sites are occupied by Zr and Ti atoms. The oxide more preferably contains at least one selected from the group consisting of Nb, Mg, Ni, and Zn as a B-site element. Examples of the oxide include materials containing a $PbMg_{1/3}Nb_{2/3}O_3$—$PbZrO_3$—$PbTiO_3$ ternary solid solution system composition, materials which are made of the $PbMg_{1/3}Nb_{2/3}O_3$—$PbZrO_3$—$PbTiO_3$ ternary solid solution system composition and which further contains 0.05 to three mass percent NiO, and materials containing a $Pb(Mg, Ni)_{1/3}Nb_{2/3}O_3$—$PbZrO_3$—$PbTiO_3$ ternary solid solution system composition. The term "made of" as used in the expression "made of the $PbMg_{1/3}Nb_{2/3}O_3$—$PbZrO_3$—$PbTiO_3$ ternary solid solution system composition" means that the content of the $PbMg_{1/3}Nb_{2/3}O_3$—$PbZrO_3$—$PbTiO_3$ ternary solid solution system composition in a piezoelectric/electrostrictive material excluding NiO is 80 mass percent or more and preferably 90 mass percent or more.

Alternatively, the piezoelectric/electrostrictive body 30 preferably contains particles made of an oxide which is represented by the formula $ABO_3$ and which contains at least one selected from the group consisting of Li, Na, K, Bi, and Ag as an A-site element and at least one selected from the group consisting of Nb, Ta, and Ti as a B-site element and more preferably contains particles made of $(Li_xNa_yK_z)Nb_MTa_NO_3$, $(Bi_xNa_yK_z)TiO_3$, or the like (wherein X, Y, Z, M, and N each represent an arbitrary number). The piezoelectric/electrostrictive body 30 may further contain an element other than those cited above. The following materials other than the oxides represented by the formula $ABO_3$ as illustrated above: for example, oxides such as $Al_2O_3$, $ZrO_2$, $TiO_2$, MgO, CaO, $Y_2O_3$, $SnO_2$, ZnO, and $SiO_2$; composite oxides such as $BaTiO_3$, $BiFeO_3$, and $YBa_2Cu_3O_7$; nitrides such as AlN, $Si_3N_4$, and BN; borides such as $CaB_6$, $MgB_2$, and $LaB_6$; carbides such as TiC, SiC, and WC; tellurides such as $Bi_2Te_3$, $Bi_2Sb_8Te_{15}$, and PbTe; silicides such as $CrSi_2$, $MnSi_{1.73}$, $FeSi_2$, and $CoSi_2$; metals; alloys; and intermetallic compound.

Figure 2A:
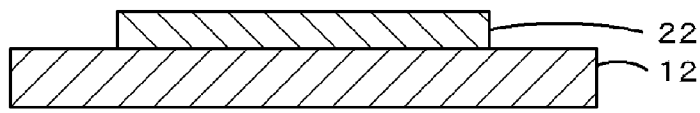
FIGS. 2A to 2F are illustrations showing an example of a method for manufacturing the piezoelectric/electrostrictive device 20.
Figure 2B:
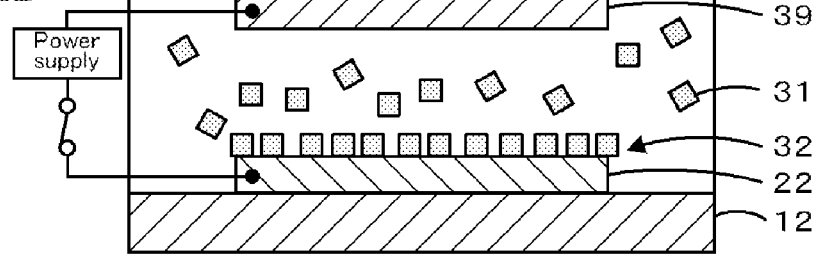
Figure 2C:
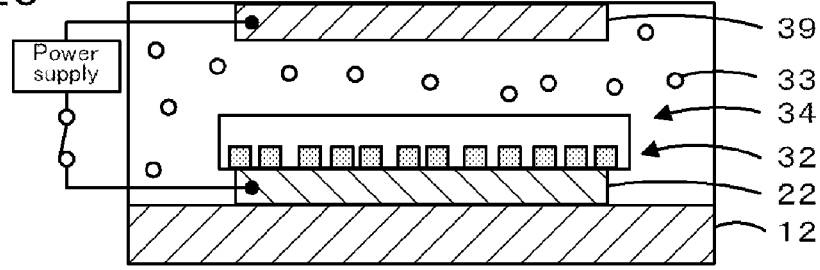
Figure 2D:
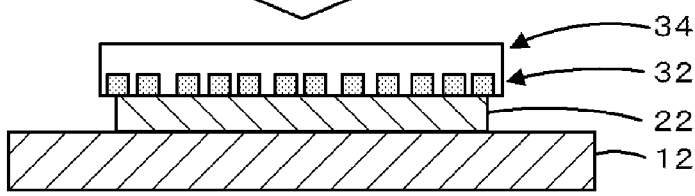
Figure 2E:
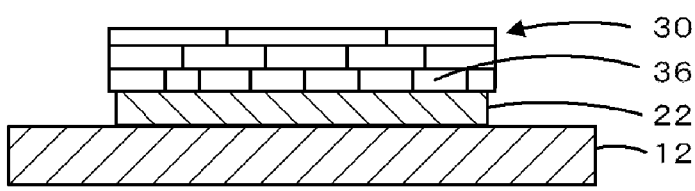
Figure 2F:
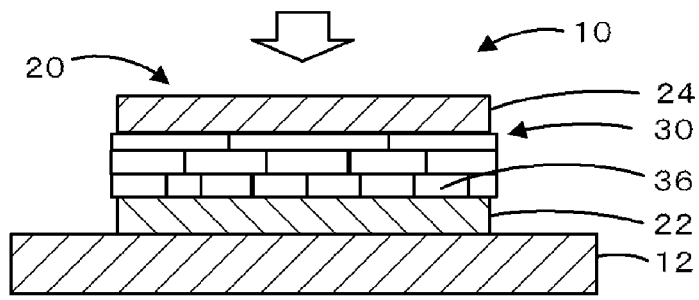

A method for manufacturing the piezoelectric/electrostrictive device 20 will now be described. The method for manufacturing the piezoelectric/electrostrictive device 20 includes (1) a first particle-preparing step of preparing pseudocubic particles 31, (2) a second particle-preparing step of preparing matrix particles 33, (3) a dispersing step of dispersing the pseudocubic particles 31 in a solvent, (9) a first electrode-forming step of forming the first electrode 22 on the base 12, (5) a first particle section-forming step of arraying/sprinkling the pseudocubic particles 31 on the first electrode 22, (6) a second particle section-forming step of providing the matrix particles 33 on the pseudocubic particles 31, (7) a firing step of firing a particle section to orientation-crystallize the particle section, and (8) a second electrode-forming step of forming the second electrode 24 on the fired piezoelectric/electrostrictive body 30. FIGS. 2A to 2F are illustrations showing an example of the method for manufacturing the piezoelectric/electrostrictive device 20. FIG. 2A is an illustration after the first electrode-forming step, FIG. 2B is an illustration of the first particle section-forming step, FIG. 2C is an illustration of the second particle section-forming step, FIG. 2D is an illustration of the base 12 taken out of slurry, FIG. 2E is an illustration after the firing step, and FIG. 2F is an illustration after the second electrode-forming step.

(1) First Particle-Preparing Step

In this step, the pseudocubic particles 31 are prepared so as to act nuclei of the oriented crystals 36 in the piezoelectric/electrostrictive device 20. Inorganic particles used to produce the pseudocubic particles 31 are preferably those growing into, for example, crystal grains with an isotropic, polyhedral shape or pseudocubic grains with substantially a cubic shape under predetermined firing conditions. The pseudocubic particles 31 may be those having substantially a cubic shape which preferably has an axial ratio of 1.0 to 1.1 or those having a shape in which each side (ridge) of a cube contains 10% or more of a straight portion, that is, a polyhedral shape such as a rounded or truncated cubic shape. Examples of the pseudocubic particles 31 include particles of compounds ($BaTiO_3$, $SrTiO_3$, $KNbO_3$, $KTaO_3$, and the like) having a perovskite structure, particles of compounds (MgO, TiN, and the like) having an NaCl structure, and particles of compounds ($CaF_2$ and the like) having a fluorite structure. In particular, a perovskite structure oxide represented by the formula $ABO_3$ is preferred. In the perovskite structure oxide, for example, the adjustment of the composition thereof or the addition of an additive (glass or the like) for promoting the surface diffusion of crystal grains to the perovskite structure oxide may allow particles to grow into grains having a growth shape under predetermined heat-treating conditions, the growth shape being a pseudocubic shape among polyhedral shapes. Such inorganic particles are preferably used. The expression "growth shape under predetermined heat-treating conditions" as used herein is defined as morphology which is observed when crystals of inorganic particles come to equilibrium under given heat-treating conditions and which is obtained by observing the shape of surface particles crystallized by firing, for example, a bulk. In order to achieve an anisotropic or polyhedral shape as the growth shape, the following system is preferably selected: a system in which a low-melting-point compound, such as glass, acting as a flux is added to a material having a grain growth temperature close to the melting point or decomposition temperature of a solid such that particles are grown through the flux. This is because the addition of the flux allows elements contained in the solid to migrate actively on the surface of the particles.

The pseudocubic particles 31 preferably contain an oxide which is represented by the formula $ABO_3$ and which contains Pb as an A-site element and least one selected from the group consisting of Zr, Ti, Nb, Mg, Ni, and Zn as a B-site element. The pseudocubic particles 31 preferably further contain 0.1% by weight or more of glass, such as lead borate glass, zinc borate glass, borosilicate glass, lead silicate glass, zinc silicate glass, and bismuth silicate glass, having a melting point of 1000° C. or lower as a flux because the growth shape at 900° C. to 1300° C. is likely to be a cubic shape. In this case, in view of the distribution of the glass, it is preferred that a powder of the glass be not directly formed into a film but be mixed with inorganic particles, the mixture be calcined, so that glass can be properly diffused therein, and a powder prepared by pulverizing the calcined mixture be used in a subsequent step. The pseudocubic particles 31 may be made of an oxide which is represented by the formula $ABO_3$ and which contains at least one selected from the group consisting of Li, Na, K, Bi, and Ag as an A-site element and at least one selected from the group consisting of Nb, Ta, and Ti as a B-site element or may be made of $(Li_XNa_YK_Z)Nb_MTa_NO_3$, $(Bi_XNa_YK_Z)TiO_3$, or the like (wherein X, Y, Z, M, and N each represent an arbitrary number). Alternatively, the pseudocubic particles 31 may be made of, for example, an oxide such as $Al_2O_3$, $ZrO_2$, $TiO_2$, MgO, CaO, $Y_2O_3$, $SnO_2$, ZnO, or $SiO_2$; a composite oxide such as $BaTiO_3$, $BiFeO_3$, or $YBa_2Cu_3O_7$; a nitride such as AlN, $Si_3N_4$, or BN; a boride such as $CaB_6$, $MgB_2$, or $LaB_6$; a carbide such as TiC, SiC, or WC; a telluride such as $Bi_2Te_3$, $Bi_2Sb_8Te_{15}$, or PbTe; a silicide such as $CrSi_2$, $MnSi_{1.73}$, $FeSi_2$, or $CoSi_2$; a metal; an alloy; or an intermetallic compound. The inorganic particles may be made of an oxide, hydroxide, carbonate, sulfate, nitrate, or tartrate of a target element and is preferably made of an oxide or carbonate thereof.

In the first particle-preparing step, the pseudocubic particles 31 are preferably prepared by a solvothermal process in which raw materials are mixed in a solvent and then treated at a temperature not lower than the boiling point of this solvent and at a pressure not less than atmospheric pressure. This allows the pseudocubic particles 31 to be relatively readily available. This solvent may be water or an organic solvent such as glycol and is preferably water. A material used to produce the particles is, for example, a salt, complex, or the like soluble in this solvent, which is used in the solvothermal process. For hydrothermal synthesis using water as a solvent, conditions for the solvothermal process include a temperature ranging from 120° C. to 250° C. and a pressure ranging from 1 to 10 atm. The use of raw materials in combination with an additive such as a chelating agent including ethylenediaminetetraacetic acid and cyclohexanediaminetetraacetic acid allows the pseudocubic particles 31 to have fewer defects.

For the use of the solvothermal process, the pseudocubic particles 31 can be prepared so as to have a smaller size and a narrower size distribution in such a manner that a source solution is finely distributed in a viscous liquid such as a polymer gel, as compared to the case of using no viscous liquid. Examples of the viscous liquid include polymer gels such as solutions containing gelators such as gelatin and polysaccharide thickeners. In particular, for the use of water as a solvent, the viscous liquid is preferably an aqueous solution of gelatin. For synthesis using an alkaline solution, alkali-treated gelatin derived from porcine is preferably used. The rate of heating raw materials to a synthesis temperature is preferably large, 12° C./min or more and more preferably 30° C./min or more. A reduction in the size of the pseudocubic particles 31 leads to a reduction in the volume ratio of a matrix layer to seed layer described below in detail, leads to an increase in the degree of freedom in composition control, and allows a wide range of final compositions to be available. If the pseudocubic particles 31 are prepared so as to have a narrower size distribution, the seed layer has a uniform thickness and grains can be uniformly grown in the synthesis of the matrix layer. This leads to a reduction in orientation and an increase in the number of grains in the thickness direction thereof.

(2) Second Particle-Preparing Step

The matrix particles 33, which are prepared in this step, may be particles in which crystals are ungrown. The composition of the matrix particles 33 may be the same as or different from that of the pseudocubic particles 31 as long as the piezoelectric/electrostrictive body 30 has a target composition. For example, after the pseudocubic particles 31 are prepared so as to have such a composition that a cubic shape is likely to be available, the composition of the matrix particles 33 may be set such that the piezoelectric/electrostrictive body 30 has a target composition. Alternatively, when a cubic shape is likely to be available even if the pseudocubic particles 31 have the same composition as the target composition of the piezoelectric/electrostrictive body 30, the composition of the matrix particles 33 may be the same as that of the pseudocubic particles 31. The matrix particles 33 preferably contain ungrown crystals because the crystallographic orientation of the matrix particles 33 can be readily adjusted to that of the pseudocubic particles 31 in the firing step. The matrix particles 33 preferably have a small size because spaces between the pseudocubic particles 31 can be readily filled with the matrix particles 33. The matrix particles 33 are preferably prepared by wet grinding using, for example, a ball mill, a bead mill, a trommel, an attritor, or the like.

(3) Dispersing Step

In this step, the pseudocubic particles 31 are dispersed in a solvent. The pseudocubic particles 31 are preferably broken to the level of primary particles in view of enhancing the crystal orientation of the piezoelectric/electrostrictive body 30. This solvent may be water or an organic solvent such as an alcohol, a ketone, a hydrocarbon, or an aromatic compound and is preferably water because of its handiness. In the dispersing step, the pseudocubic particles 31 are preferably surface-modified in view of enhancing the dispersibility thereof in such a manner that a dispersant or the like is added to this solvent. Examples of the dispersant include inorganic dispersants such as sodium silicate and sodium phosphate, organic polymeric dispersants, and surfactants. The dispersant is preferably a surfactant. Examples of the surfactant include anionic surfactants that dissociate in this solvent to produce anions, cationic surfactants that dissociate in this solvent to produce cations, and amphoteric surfactants that have anionic and cationic groups in their molecules and that become cationic, amphoteric, or anionic depending on the pH of this solvent. The anionic surfactants are those having a hydrophilic group such as a carboxyl group, a sulfonic group, or a phosphoric group. Examples of the anionic surfactants include sodium salts of fatty acids, monoalkylsulfates, alkyl polyoxyethylene sulfates, alkylbenzenesulfates, monoalkylphosphates, and polyacrylates. Examples of the cationic surfactants include tetraalkylammonium salts such as alkyltrimethylammonium salts, dialkyldimethylammonium salts, and alkylbenzyldimethylammonium salts. Examples of the amphoteric surfactants include alkyldimethylamine oxides and alkylcarboxy betaines. Among these surfactants, those, produced by polymerizing or copolymerizing monomers, having a molecular weight of about 10000 or more are referred to as polymeric dispersants. In the dispersing step, an ultrasonic wave may be applied to the dispersion containing the pseudocubic particles 31 such that the pseudocubic particles 31 are highly dispersed. The adsorption of the dispersant may be physical equilibrium adsorption or chemical adsorption on the surface of the pseudocubic particles 31. The dispersant is preferably chemically adsorbed on the pseudocubic particles 31 such that no excess of the dispersant remains in this solvent.

Alternatively, in the dispersing step, the pseudocubic particles 31 may be dispersed in this solvent in such a manner that nanoparticles are adsorbed on the pseudocubic particles 31 such that the charge of the pseudocubic particles 31 is varied. In particular, for example, a cationic dispersant is adsorbed on the pseudocubic particles 31 and a slurry containing the resulting pseudocubic particles 31 dispersed in a solvent (for example, water) is prepared. Another dispersant (anionic dispersant) opposite in nature to that adsorbed on the pseudocubic particles 31 is adsorbed on the nanoparticles and a slurry containing the resulting nanoparticles dispersed in a solvent is prepared. The mixing of these slurries causes heteroaggregation between cations on the surfaces of the pseudocubic particles 31 and anions on the surfaces of the nanoparticles; hence, a slurry containing the pseudocubic particles 31 surface-modified with the nanoparticles can be prepared. The pseudocubic particles 31 modified as described above may be dispersed in a solvent. The nanoparticles may be the matrix particles 33 or other particles different in composition from the matrix particles 33.

(4) First Electrode-Forming Step

In this step, the first electrode 22 is formed on the base 12 (FIG. 2A). The base 12, on which the first electrode 22 is provided, is preferably made of a ceramic which is sintered at a temperature higher than the temperature of heat treatment performed in a step below and which is not distorted or altered by heat treatment performed in a step below. The ceramic preferably contain, for example, at least one selected from the group consisting of zirconium oxide, aluminum oxide, magnesium oxide, mullite, aluminum nitride, and silicon nitride, more preferably principally contains zirconium oxide, and further more preferably contains stabilized zirconium oxide. The base 12 is obtained in such a manner that the ceramic is formed so as to have a desired shape and then fired. The first electrode 22 is preferably made of, for example, at least one selected from the group consisting of platinum, palladium, ruthenium, gold, silver, and an alloy containing one or more of these metals. The first electrode 22 can be formed by, for example, a sputtering process or the like using one or more of these metals. Alternatively, the first electrode 22 can be formed in such a manner that a paste containing one or more of these metals; applied to the base 12 by a doctor blade process, a screen printing process, or the like; and then fired. The thickness of the first electrode 22 depends on the thickness of the piezoelectric/electrostrictive body 30 and is preferably about 0.1 to 20 μm in view of causing or preventing the distortion of the piezoelectric/electrostrictive body 30.

(5) First Particle Section-Forming Step

Figure 3A:
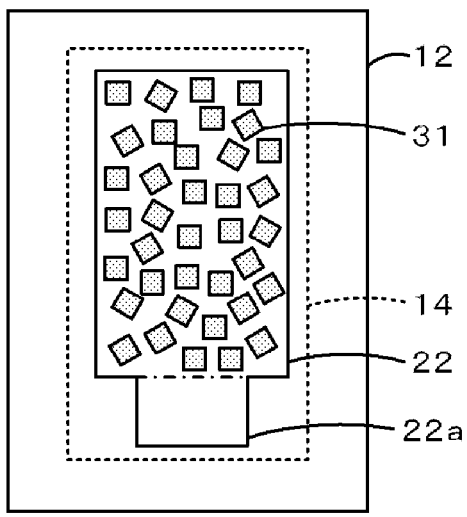
FIGS. 3A to 3C are schematic views of pseudocubic particles 31 fixed on a first electrode 22.
Figure 3B:
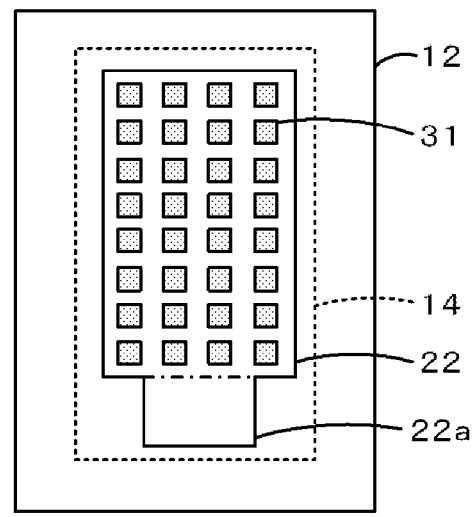
Figure 3C:
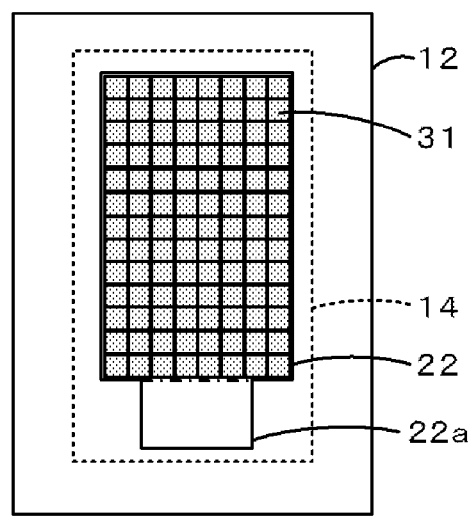

In this step, a slurry containing the pseudocubic particles 31 is used and the pseudocubic particles 31 are arranged or sprinkled on the first electrode 22. The pseudocubic particles 31 are arranged by a process such as a spin coating process in which the base 12 is coated with the pseudocubic particles 31 in such a manner that the base 12 is rotated and the slurry is dripped on the rotating base 12, a dip coating process in which the base 12 is coated with the pseudocubic particles 31 in such a manner that the base 12 is dipped in the slurry and then pulled out, or an electrophoretic process in which the base 12 is electrically coated with the pseudocubic particles 31 using formed electrodes. In particular, the electrophoretic process is preferably used herein. The electrophoretic process is described below in detail. Since the first electrode 22 is disposed on the base 12, the first electrode 22 is used as one of the electrodes (FIG. 2B). A counter electrode 39 (Pt plate) is provided at a position opposed to the first electrode 22 and is used as the other one. The first electrode 22 is immersed in the slurry and the slurry is electrophoresed in such a manner that a rectangular pulse is applied between the first electrode 22 and the counter electrode 39 at a predetermined voltage. The pseudocubic particles 31, which are contained in the slurry, are fixed by the rectangular pulse in such a state that the pseudocubic particles 31 are arranged on the upper surface of the first electrode 22, whereby a seed section 32 containing nuclei for forming the oriented crystals 36 is formed (FIG. 2B). In this operation, the pseudocubic particles 31 are not strongly fixed on portions other than the upper surface of the first electrode 22. With reference to FIG. 2, a layer of the pseudocubic particles 31 is disposed on the first electrode 22. One or more layers (for example, two layers) of the pseudocubic particles 31 may be formed on the first electrode 22. FIGS. 3A to 3C are schematic views of the pseudocubic particles 31 fixed on the first electrode 22. The pseudocubic particles 31 may be arranged only on the upper surface of the first electrode 22. The pseudocubic particles 31 may be randomly arranged on the upper surface of the first electrode 22 in a rotated state (FIG. 3A), may be arranged on the upper surface of the first electrode 22 at equal intervals (FIG. 3B), or may be arranged on the upper surface of the first electrode 22 with no spaces between the pseudocubic particles 31 (FIG. 3C). A reduction in the size of spaces in the seed section 32 leads to an increase in the density of the seed section 32 (for example, FIG. 3C), allows the seed section 32 to be layer-shaped, and allows the formation of the seed layer. After the seed section 32 is formed, the pseudocubic particles 31 are preferably fixed on the upper surface of the first electrode 22 in such a manner that the base 12 is pulled out of the slurry and then dried or treated in another way. In this step, a surface portion of the base 12 that is not coated with the pseudocubic particles 31 may be masked with resin or the like.

(6) Second Particle Section-Forming Step

In this step, the base 12 carrying the first electrode 22 and the seed section 32 disposed thereon is immersed in a slurry containing the matrix particles 33 and the matrix particles 33 are fixed on the upper surface of the seed section 32 by substantially the same electrophoretic process as that used in the first particle section-forming step, whereby a matrix section 34 is formed (FIG. 2C). The matrix section 34 may be formed at any volume ratio in view of achieving a final composition for expressing properties or in view of imparting orientation by seeds. The volume ratio of the matrix section 34 to the seed section 32 may be, for example, 1:1 or 1:4. In this step, spaces between the pseudocubic particles 31 in the seed section 32 may be filled with the matrix particles 33 such that a particle layer with a thickness equal to that of the seed section 32 is formed. Alternatively, the spaces between the pseudocubic particles 31 in the seed section 32 may be filled with the matrix particles 33 and a layer of the matrix particles 33 may be formed over the upper surfaces of the pseudocubic particles 31. After the matrix section 34 is formed, the matrix particles 33, which form the matrix section 34, are preferably fixed on the seed section 32 in such a manner that the base 12 is pulled out of the slurry and then dried or treated in another way (FIG. 2D).

(7) Firing Step

In this step, the base 12 carrying the seed section 32 and the matrix section 34 is fired such that the matrix particles 33 are crystallized and the crystallographic orientation of the matrix particles 33 are adjusted to the crystallographic orientation of the pseudocubic particles 31 arranged in the plane direction. The firing temperature of the base 12 may be within a predetermined diffusion-suppressing temperature range in which the diffusion of the matrix particles 33 is suppressed and in which the seed section 32 and the matrix section 34 are sintered. This allows the piezoelectric/electrostrictive body 30 to be readily obtained (FIG. 2E), although the composition varies in the thickness direction thereof (FIG. 2D) because the seed layer, in which the pseudocubic particles 31 are densely arranged, and the matrix layer, which contains a large number of the matrix particles 33, are present. In the piezoelectric/electrostrictive body 30, the composition and crystal orientation thereof are graded in the thickness direction. In the actuator 10, the gradient of the composition and the crystal orientation affects the flexure of a portion having the piezoelectric/electrostrictive device 20; hence, pressure-generating properties of the actuator 10 can be readily controlled. Alternatively, the firing temperature thereof may be within a temperature range in which the seed section 32 and the matrix section 34 are sintered and which exceeds the predetermined diffusion-suppressing temperature range, in which the diffusion of the matrix particles 33 is prevented. This allows the matrix particles 33 to be readily dispersed; hence, the piezoelectric/electrostrictive body 30 can be uniformly prepared. In particular, the dispersion of the matrix particles 33 is suppressed at a temperature of 900° C. to 1200° C. and is promoted at a temperature of 1250° C. or higher in the case of using, for example, lead zirconate titanate, which is an oxide which is represented by the formula $ABO_3$ and in which the A-sites are occupied by Pb atoms and the B-sites are occupied by Zr and Ti atoms. The number of the matrix particles 33 arranged in the thickness direction of the fired base 12 may be one or more. In particular, the number thereof is preferably two or more, more preferably five or more, and further more preferably ten or more in view of the reliability of insulating properties and the like of the piezoelectric/electrostrictive device 20.

(8) Second Electrode-Forming Step

The second electrode 24 is formed on the piezoelectric/electrostrictive body 30. In the method, the first electrode 22 is formed on a surface of the piezoelectric/electrostrictive body 30 and the second electrode 24 is formed on a surface of the piezoelectric/electrostrictive body 30 that is opposite to the surface having the first electrode 22 thereon. The second electrode 24 may be formed under substantially the same conditions as those used in the first electrode-forming step or under conditions different from those used in the first electrode-forming step. As described above, the actuator 10 can be manufactured so as to include the piezoelectric/electrostrictive device 20. The piezoelectric/electrostrictive device 20 includes the first electrode 22, the second electrode 24, and the piezoelectric/electrostrictive body 30 disposed therebetween and the first electrode 22 is disposed on the base 12 (FIG. 2F).

According to the piezoelectric/electrostrictive device 20 of this embodiment described above in detail, piezoelectric/electrostrictive properties thereof can be enhanced in such a manner that the degree of orientation of the piezoelectric/electrostrictive body 30 is increased by making use of the pseudocubic particles 31. Since the seed section 32 is formed by arranging the pseudocubic particles 31 on the upper surface of the base 12 and the matrix section 34 is then formed by providing the matrix particles 33 on the pseudocubic particles 31, the piezoelectric/electrostrictive body 30 is readily prepared such that a portion of the piezoelectric/electrostrictive body 30 that is close to the crystal orientation of the base 12 has enhanced crystal orientation. Since electrophoresis is performed using the first electrode 22, the pseudocubic particles 31 can be relatively readily formed only on the upper surface of the first electrode 22. The seed layer and the matrix layer are formed, the pseudocubic particles 31 are different in composition from the matrix particles 33, and the base 12 is fired at a temperature at which the diffusion of the matrix particles 33 is suppressed; hence, the piezoelectric/electrostrictive body 30 can be relatively readily prepared such that the composition and crystal orientation thereof are graded. Furthermore, the pressure-generating properties of the actuator 10 can be readily controlled. Crystal grains (pseudocubic grains) growing isotropically to a polyhedral shape, even though materials made of, for example, $Pb(Zr_{1-x}Ti_x)O_3$, can be relatively readily enhanced in crystal orientation without forming a tabular shape. The pseudocubic particles 31 can be relatively readily dispersed in a solvent in such a manner that the nanoparticles or the dispersant is adsorbed on the pseudocubic particles 31.

The present invention is not limited to the above embodiment. Various modifications may be made within the technical scope of the present invention.

Figure 4A:
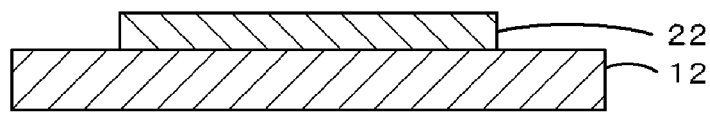
FIGS. 4A to 4F are illustrations showing an example of a method for manufacturing another piezoelectric/electrostrictive device 20.
Figure 4B:
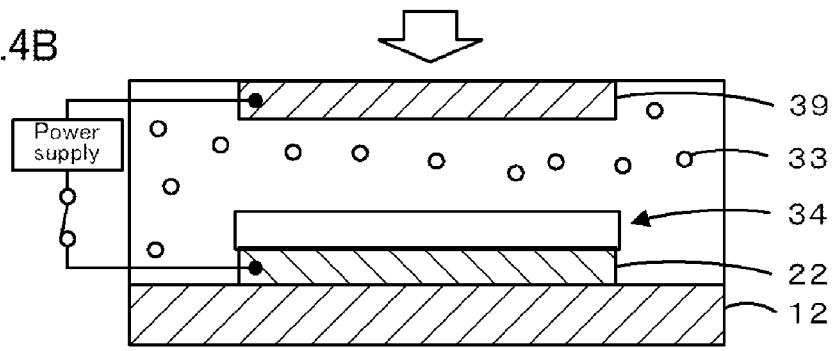
Figure 4C:
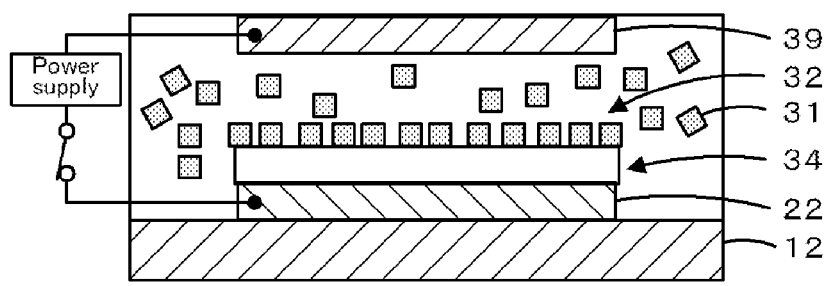
Figure 4D:
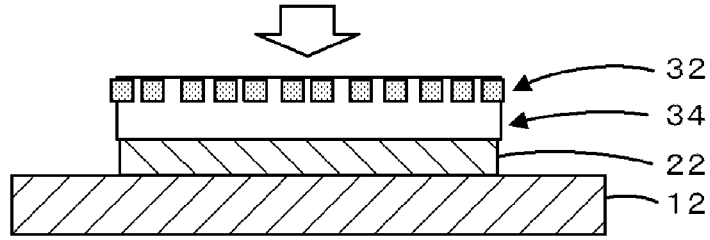
Figure 4E:
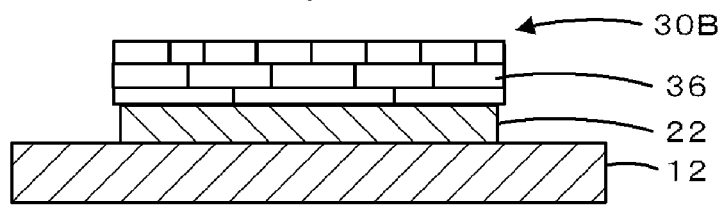
Figure 4F:
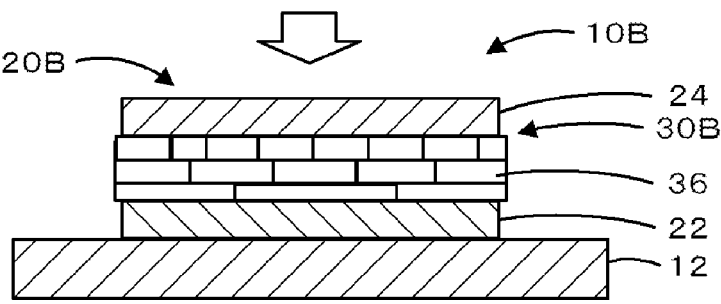

In the above embodiment, the seed section 32 is formed on the first electrode 22 and the matrix section 34 is formed on the seed section 32. However, as shown in FIG. 4, the matrix section 34 may be formed on the first electrode 22 and the seed section 32 may be formed on the matrix section 34. FIGS. 4A to 4F are illustrations showing an example of a method for manufacturing another piezoelectric/electrostrictive device 20. In particular, a first electrode 22 is formed on a base 12 (FIG. 4A), this base 12 and a counter electrode 39 are immersed in a slurry containing the matrix particles 33, and a matrix section 34 is formed on this first electrode 22 by an electrophoretic process (a spin coating process or a dip coating process) (FIG. 4B). After this base 12 is pulled out of this slurry and then dried, this base 12 is immersed in a slurry containing the pseudocubic particles 31 and a seed section 32 is formed on this matrix section 34 by an electrophoretic process (FIG. 4C). Spaces between the pseudocubic particles 31 are preferably filled with the matrix particles 33 by an electrophoretic process, a spin coating process, a dip coating process, or another process. This base 12 carrying this seed section 32 and this matrix section 34 is fired, whereby a piezoelectric/electrostrictive body 30B containing oriented crystals 36 is prepared so as to have a portion which is close to this second electrode 24 and which has a high degree of orientation (FIG. 4E). This allows an actuator 10B including this piezoelectric/electrostrictive device 20B, in which the portion close to this second electrode 24 has a high degree of orientation, to be readily prepared.

In the above embodiment, the pseudocubic particles 31 are provided only on the upper surface of that first electrode 22 by the electrophoretic process. The present invention is not limited to this manner. A resist layer (mask portion) made of resin or the like may be provided on a portion of that first electrode 22 that is not coated with the pseudocubic particles 31 and the pseudocubic particles 31 may be then arranged or sprinkled only on the upper surface of that first electrode 22 by a process, such as a spin coating process or a dip coating process, other than the electrophoretic process. This allows the crystallographically oriented ceramic to be prepared from the pseudocubic particles 31, although a step of forming the resist layer is necessary.

In the above embodiment, the actuator 10 is described as being used to apply pressure to a liquid. Those having piezoelectric/electrostrictive properties can be used other than the actuator 10. The piezoelectric/electrostrictive device 20 can be used for, for example, polycrystalline materials, such as dielectric materials, pyroelectric materials, ferroelectric materials, magnetic materials, ion-conducting materials, electron-conducting materials, heat-conducting materials, thermoelectric materials, superconducting materials, and abrasion resistant materials, containing substances having functions or properties dependent on crystallographic orientation. In particular, the piezoelectric/electrostrictive device 20 is applicable to various sensors such as acceleration sensors; pyroelectric sensors, ultrasonic sensors, electric field sensors, temperature sensors, gas sensors, knocking sensors, yaw rate sensors, air bag sensors, and piezoelectric gyro sensors; energy converters such as piezoelectric transformers; ultrasonic motors; low-loss actuators; resonators such as low-loss resonators; capacitors; piezoelectric bimorphs; vibration pickups; piezoelectric microphones; piezoelectric igniters; sonar devices; piezoelectric buzzers; piezoelectric speakers; oscillators; filters; dielectric elements; microwave dielectric elements; thermoelectric conversion elements; pyroelectric elements; magnetoresistive elements; magnetic elements; superconducting elements; resistance elements; electron-conducting elements; ion-conducting elements; PTC elements; and NTC elements. This is effective in achieving high-performance elements. The thickness and degree of orientation of the piezoelectric/electrostrictive body 30 are appropriately set to values suitable for uses thereof.

In the above embodiment, the base 12 includes the single space section 14. The base 12 may include a plurality of space sections 14 and piezoelectric/electrostrictive bodies 30. Alternatively, the base 12 may include no space section 14. An example of a base including no space section 14 is a tabular base or the like.

Figure 5A:
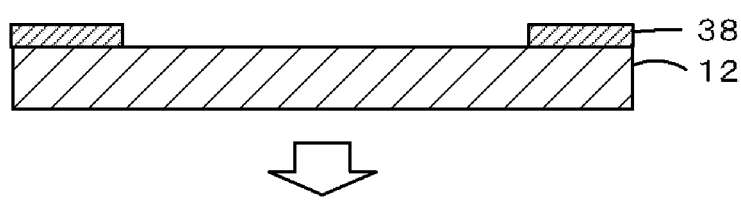
FIGS. 5A to 5C are illustrations showing a method for producing another crystallographically oriented ceramic 30C.
Figure 5B:
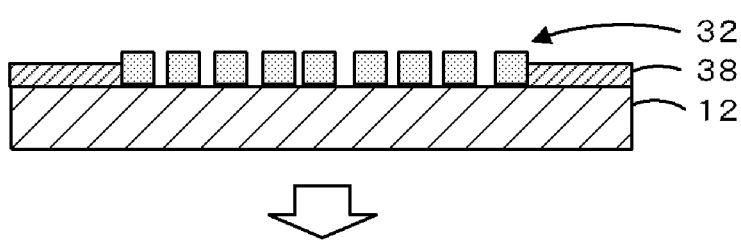
Figure 5C:
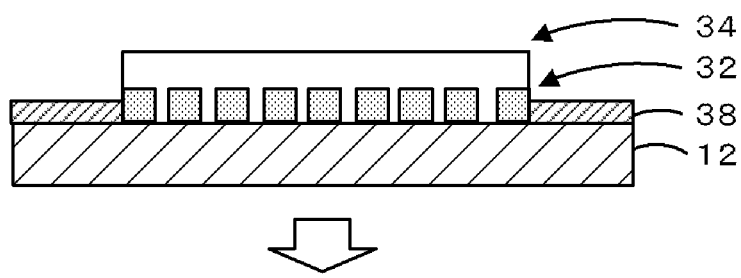
Figure 5D:
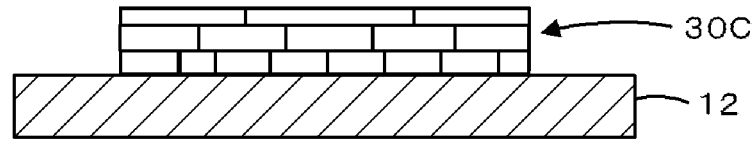
FIG. 5D is an illustration of a fired product.

In the above embodiment, the piezoelectric/electrostrictive body 30 is disposed indirectly on the base 12 with the first electrode 22 disposed therebetween as described above. The present invention is not limited to this configuration. A crystallographically oriented ceramic may be formed directly on the base 12. FIGS. 5A to 5D are illustrations showing a method for producing another crystallographically oriented ceramic 30C. FIG. 5A is an illustration of a step of forming a resist layer 38, FIG. 5B is an illustration of a step of forming a seed section 32, FIG. 5C is an illustration of a step of forming a matrix section 34, and FIG. 5D is an illustration of a fired product. In particular, the resist layer 38 is formed on a portion of the base 12 using resin or the like, the portion thereof being not coated with the pseudocubic particles 31 (FIG. 5A). The seed section 32 is formed in such a manner that the pseudocubic particles 31 are deposited on the base 12 by a spin coating process, a dip coating process, or a similar process (FIG. 58). The matrix section 34 is formed on the seed section 32 (FIG. 5C). The base 12 carrying the seed section 32 and the matrix section 34 is fired, whereby the crystallographically oriented ceramic 30C is formed directly on the base 12. This allows crystal orientation to be enhanced using the pseudocubic particles 31 even if no electrodes are used. In the above embodiment, the crystallographically oriented ceramic is contained in the piezoelectric/electrostrictive body 30 as described above. The present invention is applicable to, but is not limited to, those having enhanced properties due to oriented crystals. For example, TiN is formed into the pseudocubic particles 31, which are used for the control of slidability or friction coefficient with crystal orientation; MgO is formed into the pseudocubic particles 31, which are used to enhance photocatalytic effects by orientation control; $CaF_2$ is formed into the pseudocubic particles 31, which are used for lenses having optical anisotropy at vacuum ultraviolet wavelengths; or another material is formed thereinto.

In the above embodiment, the surface (the coated surface of the seed layer) coated with the pseudocubic particles 31 is described as being flat. The surface coated with the pseudocubic particles 31 may have, but is not limited to, irregularities or a certain curvature. Alternatively, the pseudocubic particles 31 may be formed on two or more surfaces such as opposed surfaces or surfaces perpendicular to each other.

Figure 6:
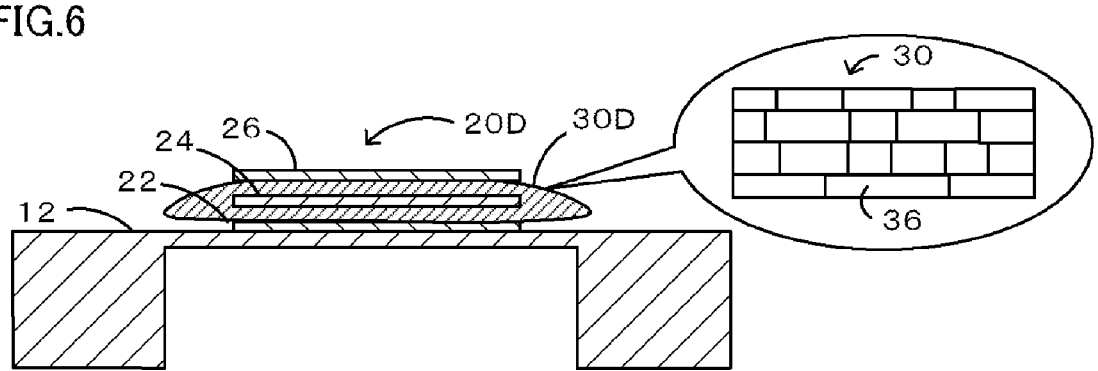
FIG. 6 is an illustration of another piezoelectric/electrostrictive device 20D.

In the above embodiment, the piezoelectric/electrostrictive body 30 is described as having a rectangular tabular shape. The shape thereof is not limited to such a shape. The piezoelectric/electrostrictive body 30 may have an arbitrary shape. The first electrode 22, the second electrode 24, and the base 12 also may have an arbitrary shape. As shown in FIG. 6, for example, a piezoelectric/electrostrictive device 20D may include, a piezoelectric/electrostrictive body 30D having a dome shape, a first electrode 22 disposed on the lower surface of the piezoelectric/electrostrictive body 30D, a second electrode 24 disposed in the piezoelectric/electrostrictive body 30D, and a third electrode 26 disposed on the upper surface of the piezoelectric/electrostrictive body 30D.

EXAMPLES

Examples of Manufacturing Piezoelectric/Electrostrictive Devices Will Now be Described Example 1

Step of Preparing Pseudocubic Particles

The following solutions were used as raw materials, weighed to produce $Pb(Zr_{0.52}Ti_{0.48})O_3$, and then sufficiently mixed with an aqueous solution of potassium hydroxide: an aqueous lead nitrate solution prepared from lead (II) nitrate produced by Kanto Kagaku, an aqueous zirconium oxychloride solution prepared from zirconium oxychloride octahydrate produced by Kanto Kagaku, and an aqueous solution of titanium chloride produced by Wako Pure Chemical. The solution mixture was poured into an autoclave (MMJ-500, manufactured by OM Labotech) and then subjected to hydrothermal synthesis at 150° C. for four hours, whereby lead zirconate titanate (PZT) pseudocubic particles having a pseudocubic (100) plane were synthesized. The pseudocubic particles were chemically analyzed with an X-ray fluorescence spectrometer (PW2400, manufactured by Philips), whereby the content of each element therein was determined.

(Step of Synthesizing Matrix Particles)

The composition of matrix particles was calculated from results obtained by the chemical analysis of the pseudocubic particles such that a composition represented by the formula $Pb(Mg_{1/3}Nb_{2/3})_{0.20}Ti_{0.43}Zr_{0.37}O_3$ was obtained when the volume ratio of the pseudocubic particles to the matrix particles was supposed to be 1:4. The following compounds were weighed on the basis of the calculation results: lead oxide, magnesium oxide, niobium oxide, titanium oxide, and zirconium oxide. The matrix particles were synthesized from the compounds by solid state reaction.

(Step of Dispersing Pseudocubic Particles and Step of Dispersing Matrix Particles)

The pseudocubic particles were surface-modified with polyethyleneimine (produced by Kanto Kagaku), which is a cationic polymer, such that the surface charge of the pseudocubic particles was varied. The pseudocubic particles were dispersed in water, whereby a slurry with a solid-to-liquid ratio of 1:20 was prepared. In particular, the pseudocubic particles were surface-modified in such a manner that after polyethyleneimine was dissolved in a slurry such that the amount of polyethyleneimine therein was four weight parts per 100 weight parts of the pseudocubic particles, the pH of this slurry was adjusted to 7.0 with diluted hydrochloric acid such that the zeta potential thereof was about 40 mV. The matrix particles, as well as the pseudocubic particles, were surface-modified with a cationic polymer and then dispersed in water, whereby a slurry with a solid-to-liquid ratio of 3:10 was prepared.

(Step of Forming First Electrode and Step of Forming Seed Layer)

A first electrode was formed on a zirconium oxide substrate (produced by Techno Chemics) from Pt by a sputtering process and immersed in the slurry prepared in the step of dispersing the pseudocubic particles, a Pt plate acting as a counter was spaced from the first electrode at a distance of 1 mm, a seed section (seed layer) containing the pseudocubic particles was formed on the first electrode by an electrophoretic process using 3-V 0.01-Hz rectangular pulses such that the pseudocubic particles were arranged or sprinkled on the first electrode. In the seed layer, the pseudocubic particles had (100) planes oriented in parallel to a surface of the substrate. The first electrode had a tab portion, which was covered with a resist layer such that the pseudocubic particles were not deposited on the tab portion. After the seed layer was formed, the substrate was pulled out of the slurry and then treated at 25° C. for ten hours at a humidity of 90, whereby the pseudocubic particles in the seed layer were fixed on the first electrode.

(Formation of Matrix Layer)

The substrate carrying the seed layer was immersed in the slurry containing the matrix particles and a matrix section (matrix layer) was then formed by substantially the same electrophoretic process as that used in the step of forming the seed layer so as to have a volume four times greater than that of the seed layer. In this electrophoretic process, spaces between the pseudocubic particles in the seed layer were filled with the matrix particles and a layer of the matrix particles was formed over the upper surfaces of the pseudocubic particles. After the matrix layer was formed, the substrate was pulled out of the slurry containing the matrix: particles and then dried at 100° C. for three minutes, whereby the matrix particles in the matrix layer were fixed on the seed layer.

(Firing Step and Step of Forming Second Electrode)

The substrate carrying the seed layer and the matrix layer was fired at 1250° C. for three hours in an air atmosphere, whereby a piezoelectric/electrostrictive body made of a crystallographically oriented ceramic which had a (100) plane oriented in parallel to a surface of the substrate and which had a composition represented by the formula Pb $(Mg_{1/3}Nb_{2/3})_{0.20}Ti_{0.43}Zr_{0.37}O_3$ was prepared. The firing temperature of the substrate was higher than a temperature range in which the diffusion of the matrix particles is suppressed, that is, in which the matrix particles are readily dispersed. After the firing step was finished, a second electrode, as well as the first electrode, was formed on the piezoelectric/electrostrictive body from Pt by a sputtering process, whereby a piezoelectric/electrostrictive device of Example 1 was obtained.

(Measurement of Degree of Orientation)

Figure 7:
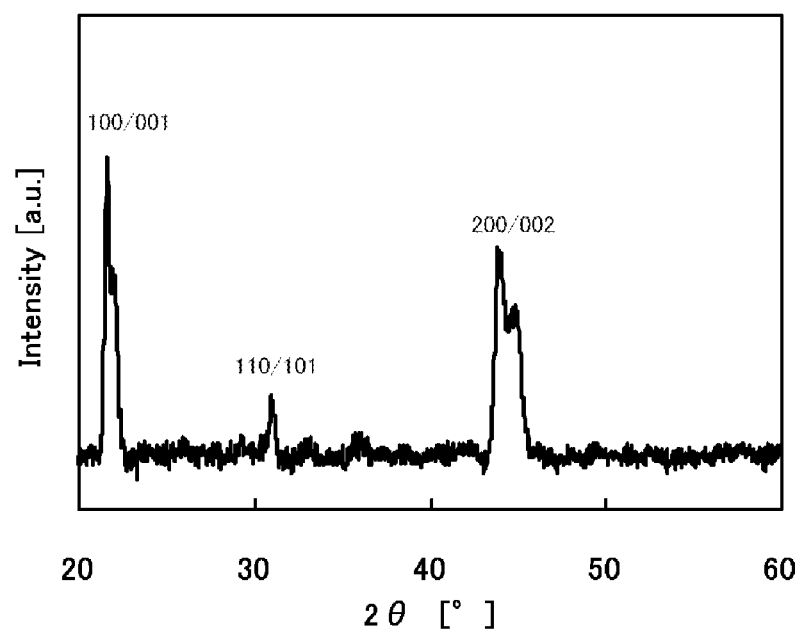
FIG. 7 is a graph showing the X-ray diffraction pattern of a piezoelectric/electrostrictive body of Example 1.

An XRD pattern was obtained in such a manner that the crystal face of the piezoelectric/electrostrictive body (crystallographically oriented ceramic film) was irradiated with an X-ray using an XRD apparatus (X'Pert PRO MPD, manufactured by Spectris). FIG. 7 shows the X-ray diffraction pattern of the piezoelectric/electrostrictive body of Example 1. The degree of orientation of the pseudocubic (100) plane was determined by the Lotgering method and then calculated from Equation (1) using the peaks each corresponding to the pseudocubic (100), (110), or (111) plane. After the firing step was finished, the X-ray diffraction pattern of the piezoelectric/electrostrictive body having no second electrode was obtained and the degree of orientation thereof was determined. The piezoelectric/electrostrictive body had a degree of orientation of 85% as determined by the Lotgering method.

Example 2

Step of Preparing Pseudocubic Particles

The following solutions were used as raw materials, weighed to produce $Pb_{1.1}(Zr_{0.52}Ti_{0.43})O_3$, and then sufficiently mixed with an aqueous solution of potassium hydroxide: an aqueous solution of lead nitrate, an aqueous solution of zirconium oxychloride octahydrate, and an aqueous solution of titanium chloride. The solution mixture was poured into an autoclave and then subjected to hydrothermal synthesis at 150° C. for four hours, whereby lead zirconate titanate (PZT) pseudocubic particles having a pseudocubic (100) plane were synthesized. The pseudocubic particles were chemically analyzed with an X-ray fluorescence spectrometer, whereby the content of each element therein was determined.

(Step of Synthesizing Matrix Particles)

The composition of matrix particles was calculated from results obtained by the chemical analysis of the pseudocubic particles such that a composition represented by the formula $Pb(Mg_{1/3}Nb_{2/3})_{0.2}Ti_{0.43}Zr_{0.37}O_3$ was obtained when the volume ratio of the pseudocubic particles to the matrix particles was supposed to be 1:4. The following compounds were weighed on the basis of the calculation results: lead oxide, magnesium oxide, niobium oxide, titanium oxide, and zirconium oxide. The matrix particles were synthesized from the compounds by solid state reaction.

(Steps of Dispersing Particles, Step of Forming First Electrode, and Steps of Forming Layers)

Through substantially the same steps as those described in Example 1, a slurry containing the pseudocubic particles and a slurry containing the matrix particles were prepared. A first electrode was formed on a base through substantially the same step as that described in Example 1. The pseudocubic particles were arranged or sprinkled on the first electrode by an electrophoretic process, whereby a seed layer was formed. A layer of the matrix particles was formed over spaces between the pseudocubic particles in the seed layer and the upper surfaces of the pseudocubic particles through substantially the same step as that described in Example 1, whereby a matrix layer was formed.

(Firing Step and Step of Forming Second Electrode)

The substrate carrying the seed layer and the matrix layer was fired at 1200° C. for three hours in an air atmosphere, whereby a piezoelectric/electrostrictive body made of a crystallographically oriented ceramic which had a (100) plane oriented in parallel to a surface of the substrate and which had a composition represented by the formula Pb $(Mg_{1/3}Nb_{2/3})_{0.20}Ti_{0.43}Zr_{0.37}O_3$ was prepared. The firing temperature of the substrate was within a temperature range in which the diffusion of the matrix particles is suppressed.

(Measurement of Degree of Orientation and Study on Orientation Gradient and Composition Gradient)

The degree of orientation of a piezoelectric/electrostrictive body prepared in Example 2 was determined by substantially the same technique as that used in Example 1. As a result, the degree of orientation of the piezoelectric/electrostrictive body was 80 determined by the Lotgering method. This confirmed that crystals therein were oriented. The crystal structure of the piezoelectric/electrostrictive body (crystallographically oriented ceramic film) measured in the thickness direction thereof by grazing-incidence X-ray diffractometry. This showed that the (100) lattice constant increased from the substrate toward a surface of the piezoelectric/electrostrictive body. The composition of the piezoelectric/electrostrictive body was evaluated in the thickness direction thereof with a secondary ion mass spectrometry (SIMS) (TOF-SIMS IV, manufactured by CANECA/ION TOF). As a result, the concentration of $Pb(Mg_{1/3}Nb_{2/3})O_3$ was confirmed to be graded in the thickness direction thereof. That is, the piezoelectric/electrostrictive body of Example 2 was determined to be a crystallographically oriented ceramic film of which the crystal structure and composition were graded in the thickness direction thereof. This showed that a gradient material can be readily prepared in such a manner that a seed layer and a matrix layer are formed on a base and the firing temperature of the base is controlled.

Example 3

Step of Preparing Pseudocubic Particles and Step of Preparing Matrix Particles

In Example 3, the following technique was investigated: a technique in which nanoparticles were adsorbed on pseudocubic particles and the pseudocubic particles were then dispersed. The following particles were synthesized through substantially the same step as that described in Example 1: PZT pseudocubic particles having a composition represented by the formula $Pb(Zr_{0.52}Ti_{0.48})O_3$ and a pseudocubic (100) plane. Matrix particles having a composition represented by the formula $Pb(Mg_{1/3}Nb_{2/3})_{0.20}Ti_{0.43}Zr_{0.37}O_3$ were synthesized through substantially the same step as that described in Example 1.

(Dispersion of Pseudocubic Particles and Modification of Pseudocubic Particles with Nanoparticles)

The obtained pseudocubic particles were surface-modified with polyethyleneimine, which is a cationic polymer, and then dispersed in water, whereby slurry was prepared. The obtained matrix particles were dispersed in water with an anionic polycarboxylic polymer dispersant (Aron A6114, produced by TOAGOSEI) and then pulverized to an average particle size of 30 nm in a bead mill. The term "average particle size" as used herein refers to a median diameter (D50) determined with a dynamic scattering particle size distribution analyzer, Zetasizer Nano ZS, manufactured by Spectris using water as a dispersion medium. The slurry containing the pseudocubic particles was mixed with a slurry containing nanoparticles prepared from the matrix particles such that the pseudocubic particles were surface-modified with the nanoparticles by the heteroaggregation of cations on the pseudocubic particles and anions on the nanoparticles, whereby a slurry containing the modified pseudocubic particles was prepared.

(Step of Forming First Electrode, Steps of Forming Layers, and Firing Step)

A first electrode was formed on a substrate through substantially the same step as that described in Example 1. The pseudocubic particles were arranged or sprinkled on the first electrode by an electrophoretic process using this slurry, whereby a seed layer was formed. A layer of the matrix particles was formed over spaces between the pseudocubic particles in the seed layer and the upper surfaces of the pseudocubic particles through substantially the same step as that described in Example 1, whereby a matrix layer was formed. The substrate carrying the seed layer and the matrix layer was fired at 1250° C. for three hours in an air atmosphere, whereby a piezoelectric/electrostrictive body made of a crystallographically oriented ceramic which had a (100) plane oriented in parallel to a surface of the substrate and which had a composition represented by the formula $Pb(Mg_{1/3}Nb_{2/3})_{0.20}Ti_{0.43}Zr_{0.37}O_3$ was prepared. The obtained crystallographically oriented ceramic had a degree of orientation of 80% as determined by the Lotgering method and therefore crystals therein were confirmed to be oriented.

Example 4

The following solutions were used as raw materials, weighed to produce $Pb(Zr_{0.70}Ti_{0.30})O_3$, and then sufficiently mixed with an aqueous solution of potassium hydroxide: a transparent lead chelate solution that was prepared in such a manner that an equimolar amount of ethylenediaminetetraacetic acid (produced by Kanto Kagaku) was added to an aqueous lead nitrate solution prepared from lead (II) nitrate trihydrate (produced by Kanto Kagaku) and a fourfold molar amount of potassium hydroxide (produced by Kanto Kagaku) with respect to ethylenediaminetetraacetic acid was then added to the mixture, an aqueous zirconium solution prepared from zirconium oxychloride octahydrate (produced by Kanto Kagaku), and an aqueous solution of titanium chloride (produced by Wako Pure Chemical). Alkali-treated porcine-derived gelatin produced by Jellice was dissolved in 60° C. water, whereby an aqueous gelatin solution was prepared. The aqueous gelatin solution was cooled to room temperature and then mixed with the raw material solution such that content of the gelatin in this mixture was 5% by weight. This mixture was homogenized for one hour with a homogenizer while being cooled, whereby a solution mixture containing the gelatin and the raw material solution highly dispersed therein. Into a 10-ml pressure vessel, 3 ml of the solution mixture was poured. The pressure vessel was placed into an autoclave (manufactured by AKICO). The solution mixture was heated to 165° C. at a rate of 33° C./min and then subjected to hydrothermal synthesis at 165° C. for four hours, whereby lead zirconate titanate (PZT) pseudocubic particles having a particle size (median diameter) of 800 nm and a pseudocubic (100) plane were synthesized. A piezoelectric/electrostrictive body of Example 4 was prepared through substantially the same steps as those described in Example 1. An obtained crystallographically oriented ceramic had a degree of orientation of 90% as determined by the Lotgering method and therefore crystals therein were confirmed to be oriented.

The present application claims the benefit of the priority from Japanese Patent Application No. 2008-243992 filed on Sep. 24, 2008, and Japanese Patent Application No. 2009-172758 filed on Jul. 24, 2009, the entire contents of both of which are incorporated herein by reference.

What is claimed is:

1. A method for producing a crystallographically oriented ceramic, comprising:
   a particle-preparing step of preparing pseudocubic particles having substantially a cubic shape;
   a dispersing step of dispersing the pseudocubic particles in a solvent;
   a particle section-forming step of forming a seed section and a matrix section directly or indirectly on a predetermined base, the seed section being formed by arranging the dispersed pseudocubic particles in a predetermined plane direction, the matrix section being formed from matrix particles having a desired composition; and
   a firing step of firing the seed section and matrix section formed on the base such that the crystallographic orientation of the matrix particles contained in the matrix section is adjusted to the crystallographic orientation of the pseudocubic particles which are contained in the seed section and which are arranged in the predetermined plane direction.

2. The method for producing a crystallographically oriented ceramic according to claim 1, wherein in the particle section-forming step, the seed section and the matrix section are formed on the base in such a manner that the seed section is formed by arranging the pseudocubic particles on the base and the matrix section is then formed by providing the matrix particles on the pseudocubic particles.

3. The method for producing a crystallographically oriented ceramic according to claim 2, further comprising an electrode-forming step of forming an electrode on the base, the electrode-forming step being prior to the particle section-forming step, wherein in the particle section-forming step, the seed section is formed on the electrode disposed on the base by an electrophoretic process using the electrode.

4. The method for producing a crystallographically oriented ceramic according to claim 2, wherein in the particle section-forming step, the seed section is formed by sprinkling the pseudocubic particles on the base and the matrix section is formed in such a manner that spaces between the sprinkled pseudocubic particles are filled with the matrix particles.

5. The method for producing a crystallographically oriented ceramic according to claim 4, wherein in the particle section-forming step, a mask portion is formed on a surface portion of the base that is not coated with the pseudocubic particles and the seed section is then formed by sprinkling the pseudocubic particles on the base.

6. The method for producing a crystallographically oriented ceramic according to claim 2, wherein in the dispersing step, the pseudocubic particles are dispersed in such a manner that nanoparticles are adsorbed on the pseudocubic particles such that the charge of the pseudocubic particles is varied.

7. The method for producing a crystallographically oriented ceramic according to claim 2, wherein in the dispersing step, the pseudocubic particles are dispersed in such a manner that at least one of a polymer and a surfactant is adsorbed on the pseudocubic particles such that the charge of the pseudocubic particles is varied.

8. The method for producing a crystallographically oriented ceramic according to claim 2, wherein a seed layer including the seed section and a matrix layer including the matrix section are formed in the particle section-forming step and the seed layer and the matrix layer are fired in the firing step within a predetermined diffusion-suppressing temperature range in which the diffusion of the matrix particles is suppressed.

9. The method for producing a crystallographically oriented ceramic according to claim 8, wherein in the particle section-forming step, the seed section and the matrix section are formed so as to have different compositions.

10. The method for producing a crystallographically oriented ceramic according to claim 2, wherein in the particle-preparing step, the pseudocubic particles are prepared by a solvothermal process in which raw materials are mixed in a solvent and then treated at a temperature not lower than the boiling point of this solvent at atmospheric pressure and at a pressure not less than atmospheric pressure.

11. The method for producing a crystallographically oriented ceramic according to claim 10, wherein in the particle-preparing step, the pseudocubic particles are prepared by a hydrothermal synthesis process that is a kind of solvothermal process using water as a solvent.

12. The method for producing a crystallographically oriented ceramic according to claim 1, wherein in the particle section-forming step, the seed section and the matrix section are formed on the base in such a manner that the matrix section is formed by providing the matrix particles on the base and the seed section is formed by arranging the pseudocubic particles on the matrix section.

13. The method for producing a crystallographically oriented ceramic according to claim 12, further comprising an electrode-forming step of forming an electrode on the base, the electrode-forming step being prior to the particle section-forming step, wherein in the particle section-forming step, the matrix section is formed on the electrode disposed on the base by an electrophoretic process using the electrode.

14. The method for producing a crystallographically oriented ceramic according to claim 12, wherein in the particle section-forming step, the seed section is formed by sprinkling the pseudocubic particles on the matrix section and spaces between the sprinkled pseudocubic particles are filled with the matrix particles.

15. The method for producing a crystallographically oriented ceramic according to claim 14, wherein in the particle section-forming step, a mask portion is formed on a surface portion of the base that is not coated with the pseudocubic particles and the seed section is then formed by sprinkling the pseudocubic particles on the base.

16. The method for producing a crystallographically oriented ceramic according to claim 1, wherein in the particle section-forming step, the seed section is formed in such a manner that the dispersed pseudocubic particles are arranged in the predetermined plane direction by one of a spin coating process and a dip coating process.

17. The method for producing a crystallographically oriented ceramic according to claim 1, wherein the pseudocubic particles having substantially a cubic shape are cube-shaped particles having an axial ratio of 1.0-1.1.

18. The method for producing a crystallographically oriented ceramic according to claim 1, wherein the pseudocubic particles having substantially a cubic shape are cube-shaped particles, each side of which contains 10% or more of a straight portion.

* * * * *